United States Patent [19]
Ishihara

[11] Patent Number: 5,154,135
[45] Date of Patent: Oct. 13, 1992

[54] APPARATUS FOR FORMING A DEPOSITED FILM

[75] Inventor: Shunichi Ishihara, Ebina, Japan

[73] Assignee: Canon Kabushiki Kaisha, Tokyo, Japan

[21] Appl. No.: 652,249

[22] Filed: Feb. 6, 1991

Related U.S. Application Data

[63] Continuation of Ser. No. 268,616, Nov. 7, 1988, abandoned, which is a continuation of Ser. No. 80,235, Jul. 27, 1987, abandoned, which is a continuation of Ser. No. 753,558, Jul. 10, 1985, abandoned.

[30] Foreign Application Priority Data

Jul. 16, 1984 [JP] Japan .......................... 59-146032

[51] Int. Cl.⁵ .................................. C23C 16/00
[52] U.S. Cl. ..................... 118/719; 118/723; 118/724; 118/50.1; 427/255.2; 427/578
[58] Field of Search .............. 118/719, 723, 724, 50.1; 427/255.2, 39

[56] References Cited

U.S. PATENT DOCUMENTS

| | | | |
|---|---|---|---|
| 3,366,090 | 1/1968 | Hough | 118/723 |
| 4,123,244 | 10/1978 | Leclercq et al. | 427/250 X |
| 4,138,306 | 2/1979 | Niwa | 427/95 X |
| 4,262,631 | 4/1981 | Kubacki | 118/723 |
| 4,469,715 | 9/1984 | Madan | 427/94 |
| 4,485,121 | 11/1984 | Matsumura | 427/95 X |
| 4,521,447 | 6/1985 | Ovshinsky | 427/45.1 |
| 4,522,663 | 6/1985 | Ovshinsky et al. | 427/39 |
| 4,522,674 | 6/1985 | Ninomiya | 118/724 |

FOREIGN PATENT DOCUMENTS

| | | | |
|---|---|---|---|
| 58-202533 | 11/1983 | Japan | 118/723 |
| 60-50169 | 3/1985 | Japan | 250/423 R |

OTHER PUBLICATIONS

Websters New Collegiate Dictionary, ©1975, G & C Merriam Co., p. 1181.
Brodsky, IBM TDB, vol. 22, No. 8A, Jan. 1980, pp. 3391-3392.

Primary Examiner—Richard Bueker
Attorney, Agent, or Firm—Fitzpatrick, Cella, Harper & Scinto

[57] ABSTRACT

An apparatus for forming a deposited film comprises a deposition chamber holding a carrier therein, a halogen radical-introducing tube for introducing into said chamber a radical containing at least halogen atoms and a hydrogen radical-introducing tube for introducing into said chamber a radical containing hydrogen atoms, the halogen radical-introducing tube and the hydrogen radical-introducing tube each having an angle of 40° to 50° to the surface of said carrier, and a deposited film is formed on said carrier from said radicals.

9 Claims, 1 Drawing Sheet

APPARATUS FOR FORMING A DEPOSITED FILM

This application is a continuation of application Ser. No. 07/268,616, filed Nov. 7, 1988, now abandoned, which in turn, is a continuation of application Ser. No. 080,235, filed Jul. 27, 1987, now abandoned, which in turn, is a continuation of application Ser. No. 753,558, filed Jul. 10, 1985, now abandoned.

BACKGROUND OF THE INVENTION

1. Field of the Invention

This invention relates to an apparatus for forming a desired deposited film on carrier, particularly to an apparatus for forming a deposited film of amorphous silicon (hereinafter referred to as a-Si) on a carrier, more particularly to an apparatus for forming an a-Si film on a carrier utilizing a chemical reaction of radicals.

2. Description of the Prior Art a-Si is excellent in electrical characteristic, photoelectric characteristic, etc., has wide applications such as solar cell, electrophotographic photosensitive material, photosensor, thin film transistor and the like, and thus, is one promising material.

Deposited films of a-Si are generally produced in accordance with a plasma decomposition process utilizing glow discharge, a so-called CVD (chemical vapor deposition) process (such as a thermal CVD process, a homo-CVD process, and the like.

Generally in the plasma decomposition process, a material gas which is monosilane ($SiH_4$) or its dilution with $H_2$, Ar, He or the like is decomposed utilizing glow discharge and an a-Si film is formed on a desired carrier with the decomposed gas. This a-Si film has an excellent photoconductivity because the number of uncombined bonds of Si in the film is as small as about $10^{15}$ cm$^{-3}$. The film has a dark conductivity of about $10^{-9}$ ($\Omega$-cm)$^{-1}$ and a light conductivity of about $10^{-5}$ ($\Omega$-cm)$^{-1}$ under the irradiation of a light of 600 nm having a light intensity of 1 mw/cm$^2$.

However, the plasma decomposition process utilizing glow discharge has the following drawbacks.

1. In a plasma formed under discharge, various ions and radicals are inevitably generated and it is difficult to obtain only a desired radical. Some of the ions and radicals generated, particularly some ions have unfavorable effects on the characteristics of the film thus formed. The larger the electric power applied, the more is the kind of the ions and radicals generated.

2. A faster film deposition speed needs a larger electric power. However, a larger electric power causes a larger film etching and consequently film formation at a high deposition speed is not possible.

3. An inflammable gas such as $SiH_4$ or the like is used as a material gas and hence there is a possibility of explosion.

In the thermal CVD process, a material gas such as monosilane or the like is thermally decomposed to form a radical and the radical is allowed to adhere to a carrier, whereby is produced on the carrier a deposited film of a-Si or the like. That is, $SiH_4$ gas, for example, is applied to a carrier heated to about 500° C.; there occurs the following reaction on the surface of the carrier; thereby a $SiH_2$ radical is generated.

$$SiH_4 \xrightarrow{\Delta} SiH_2 + H_2$$

It is understood that this $SiH_2$ radical adheres to the carrier surface and an a-Si film is formed on the carrier. In this process, only a desired radical is formed and ions believed to have adverse effects on film characteristics are not generated. Further, the film thus formed is not etched. Therefore, film formation at a high deposition speed is possible.

However, this process has the following drawback. That is, it is necessary that the carrier is heated to a temperature higher than the decomposition temperature of the material gas (e.g. higher than 450° C. when the material gas is $SiH_4$); as a result, hydrogen atoms terminating the uncombined bonds of silicon disappear resulting in increased number of uncombined bonds of Si atom; a film having a good photoconductive characteristic can not be obtained.

In the homo-CVD process proposed by Scott et al. of I.B.M. Co. of USA, a material gas such as $SiH_4$ or the like is decomposed in a gas phase and applied to a carrier cooled to about 300° C., whereby an a-Si film is formed In this process, since a decomposed gas is used, heating of the carrier to temperature higher than the decomposition temperature of the material gas is not necessary and a film of good photoconductive characteristic can be obtained. However, since a radical such as $SiH_2$ or the like formed by thermal decomposition has a short life of several tens msec, the radical can not be effectively utilized for film formation and accordingly a high film deposition speed can not be attained. Further there is still a problem associated with the use of an inflammable gas such as $SiH_4$ and the like. Gases such as $SiF_4$ and the like, containing halogen atoms in the molecule are non-flammable and have no fear of explosion. Further, radicals such as $SiF_2$ and the like produced from the decomposition of the above gases have a relatively long life. Therefore, the gases such as $SiF_4$ and the like have been considered to be a preferable material gas for a-Si films according to CVD processes. However, because of low reactivity of radicals produced from these gases, the gases could not be effectively used in a-Si film formation apparatuses employed in conventional CVD processes and hence no good a-Si film could be formed from such gases.

SUMMARY OF THE INVENTION

The present invention has been completed under the above situation. An object of the present invention is to provide a novel apparatus for deposited film formation which is free from the above mentioned drawbacks of conventional processes and can form a deposited film of excellent film characteristics on a carrier at a high deposition speed.

Another object of the present invention is to provide a novel apparatus for deposited film formation which can form a deposited film using a material gas of no explosiveness such as $SiF_4$ or the like.

Still another object of the present invention is to provide an apparatus for forming a deposited film, characterized in that said apparatus comprises a deposition chamber holding a carrier therein, a halogen radical-introducing tube for introducing into said chamber a radical containing at least halogen atoms (hereinafter this radical is referred to as a halogen radical) and a hydrogen radical-introducing tube for introducing into said chamber a radical containing hydrogen atoms (hereinafter this radical is referred to as a hydrogen radical), the halogen radical-introducing tube and the hydrogen radical-introducing tube, each having an angle of 40° to 50° to the surface of said carrier, and a deposited film is formed on said carrier from said radicals.

DESCRIPTION OF THE PREFERRED EMBODIMENTS

Figure 1:
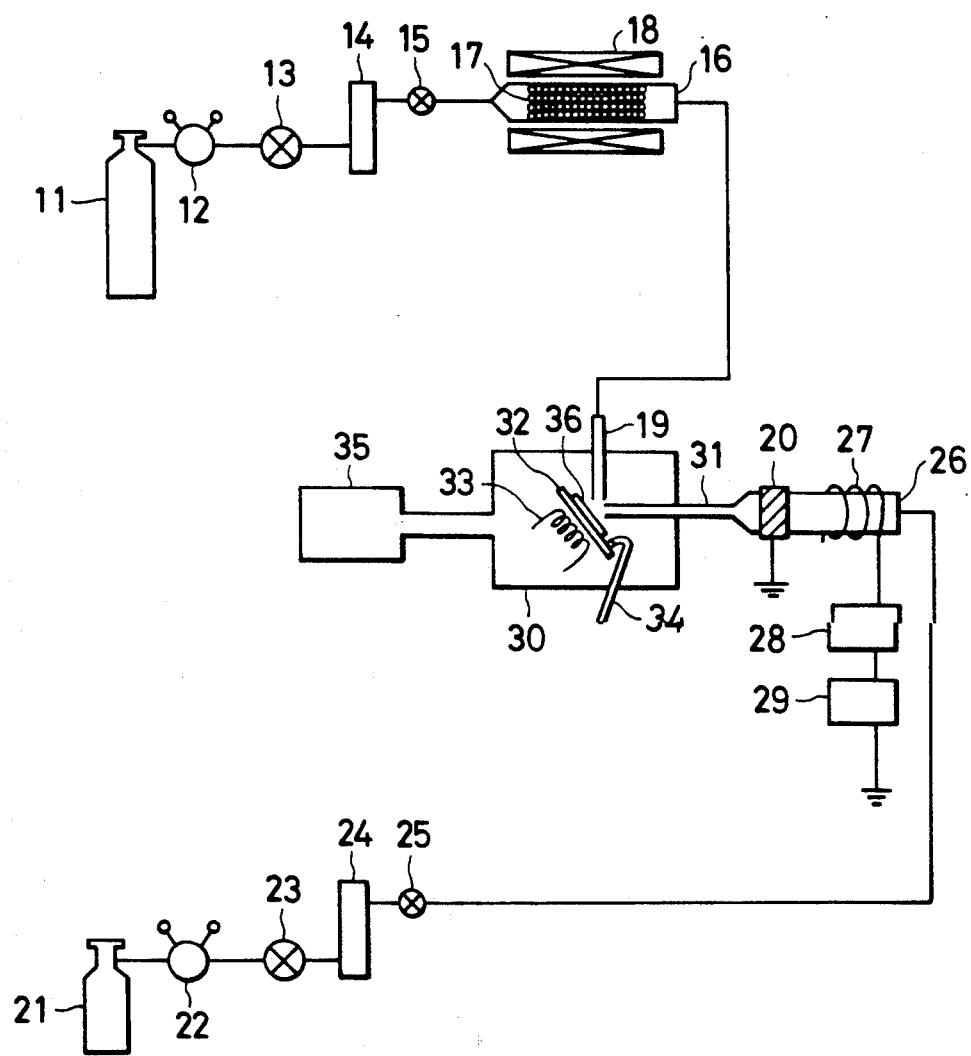
FIG. 1 is a schematic view of one embodiment of the deposited film formation apparatus according to the present invention.

In the present invention apparatus, a halogen radical of low reactivity is reacted in a deposition chamber with a hydrogen radical separately introduced into the deposition chamber to convert to a new radical of high activity containing, for example, halogen, silicon and hydrogen atoms and to form an a-Si film on a carrier held in the deposition chamber. The halogen radical and the hydrogen radical are prepared by decomposing respective material gases using a decomposition means such as a discharge energy (e.g. glow discharge, arc discharge, microwave), a heat energy or the like. Any suitable decomposition means can be selected depending upon the type of material gas employed; however, preferred is a thermal decomposition means wherein only particular radicals are formed. Of course, a decomposition means utilizing discharge may be used when there is used material gas of high decomposition temperature such as $H_2$ or the like.

The present invention will be explained in detail below referring to FIG. 1. For simplification of explanation, there is described a case wherein the halogen radical is $SiF_2$ radical and the hydrogen radical is H radical to form an a-Si film. The same explanation is applied also to cases wherein other radicals are used.

FIG. 1 is an embodiment of the present invention apparatus and is a schematic view of a deposited film formation apparatus according to the present invention.

In FIG. 1, 30 is a deposition chamber wherein an a-Si film is formed. The inside of the deposition chamber 30 can be maintained at a desired pressure by an exhaust gas system 35 constituted by a rotary pump, a diffusion pump, etc. not shown in the drawing. The pressure inside the deposition chamber 30 is suitably $5 \times 10^{-3}$ Torr or lower. The deposition chamber 30 is provided with a halogen radical-introducing tube 19 and a hydrogen radical-introducing tube 31. Through these tubes are introduced into the deposition chamber 30 a halogen radical and a hydrogen radical each having a definition previously given, and from these radicals is formed an a-Si film on a carrier 36 held by a carrier holder 32 in the deposition chamber.

33 is a heater for heating the carrier 36 and heats the carrier 36 from its backside via the carrier holder 32. To the surface of the carrier holder is fixed a thermocouple 34 connected to a temperature-controlling mechanism (not shown) for detection and control of the temperature of the carrier holder 32. In this invention, since an a-Si film is formed with radicals introduced, heating of carrier is not necessarily required; however, a heating means as mentioned above may be provided for making carrier temperature uniform and optimizing film formation conditions.

11 is a gas bomb for material-gas ($SiF_4$ gas in this case) for forming a $SiF_4$ radical. The gas is adjusted to a desired pressure by the use of a gas regulator 12. A suitable pressure is about 2 kg/cm². 13 is a valve, 14 and 15 are flow meter and a needle valve, respectively, for controlling the flow rate of the gas. The $SiF_4$ gas controlled to a desired flow rate by the flow meter 14 and the needle valve 15 is introduced into a reaction furnace 16 for forming a $SiF_2$ radical. These material gas-supplying means (bomb 11, flow meter 14, needle valve 15, etc.) may each be provided in plurality depending upon the type of material gas used, etc.

The reaction furnace 16 can be any type as long as it can form a desired radical such as $SiF_2$ or the like. The furnace 16 can be any type using one of various gas decomposition means such as discharge energy, thermal energy and the like; however, preferred is a thermal decomposition type wherein only a desired radical is formed. When a $SiF_2$, for example, is formed as in this case, one of thermal decomposition reactions such as the following is utilized.

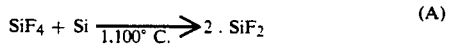

$$SiF_4 + Si \xrightarrow{1,100° C.} 2 \cdot SiF_2 \quad (A)$$

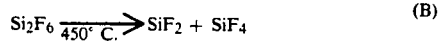

$$Si_2F_6 \xrightarrow{450° C.} SiF_2 + SiF_4 \quad (B)$$

The reaction furnace 16 of this case is suitable for conducting the thermal decomposition reaction represented by the formula (A). The reaction furnace is a quartz glass tube having an inside diameter of 50 mm and a length of 30 cm. The inside of the tube (through 15 cm in the center of the tube in this case) packed with a high purity Si crystal 17 in the form of lumps. The Si crystal 17 is heated by an infrared heater 18 to a temperature necessary for formation of $SiF_2$ radical, namely, about 1,100° C. About 60% or more of the $SiF_4$ gas which passed through the reaction furnace 16 is converted to a $SiF_2$ radical. The furnace 16 has no particular limitation in form and can take not only a cylindrical form as above but also other forms such as square and the like. The furnace 16 is not particularly restricted in material, either. When a material gas can be easily decomposed in gas phase as in the formula (B), the decomposition can be sufficiently conducted just by passing the material gas through a furnace not packed with any solid such as the Si crystal 17.

The $SiF_2$ radical formed in the reaction furnace 16 is introduced into a deposition chamber 30 through a halogen radical-introducing tube 19. The tube 19 in this case is a quartz glass tube having an inside diameter of 10 mm.

A material gas ($H_2$ gas in this case) for forming a hydrogen radical is controlled, as in the case of the material gas for forming a $SiF_2$ radical, to a desired pressure and a desired flow rate by a material gas supply source constituted by a gas bomb 21 holding the material gas, a gas regulator 22, a bellow valve 23, a flow meter 24, a needle valve 25, etc. and is fed to a reaction furnace 26. The pressure of the material gas is suitably about 2 kg/cm².

The reaction furnace 26, as in the case of the reaction furnace 16 for the $SiF_2$ radical, can be any type using one of various decomposition means such as discharge energy, thermal energy and the like. The reaction furnace 26 in this case is a type utilizing discharge because hydrogen as a material gas has a high decomposition temperature. The furnace body is a quartz glass tube having an inside diameter of 50 mm and a length of 30 cm. At one end of the furnace 26 and on its outer surface, there is provided a coil 27. At the other end of the furnace 26 and on its outer surface, there is provided a copper plate 20. The coil 27 and the copper plate 20 are for generating discharge (preferably, glow discharge, arc discharge or the like). The coil 27 is provided so as to surround one end of the furnace 26 (3 turns in this case) and one end of the coil 27 is connected to a high frequency electricity source 29 via a matching box 28. On the outer surface of the furnace 26 away from the other end of the coil 27 (5 cm apart from the other end of the coil 27 in this case), there is provided the copper plate 20 so as to surround the surface 26. The copper plate 20 is grounded. When a high frequency is applied to the coil 27, discharge is generated between the coil 27 and the copper plate 20, whereby the material gas inside the furnace 26 is decomposed. An outside discharge system is employed in this case; however, an inside discharge system may be used by providing electrodes inside the furnace 26.

The hydrogen radical formed in the reaction furnace 26 is introduced into the deposition chamber 30 through a hydrogen radical-introducing tube 31. This tube is a quartz glass tube of 10 mm in inside diameter, in this case.

The $SiF_2$ radical and the hydrogen radical separately introduced into the deposition chamber 30 are mixed in the deposition chamber 30 and converted to a radical of high reactivity such as, for example, SiHF or the like. This radical of high reactivity adheres to a carrier 36 provided inside the deposition chamber 30 to form an a-Si film on the carrier 36.

In the present invention apparatus, since film formation is made by utilizing the two different radicals effectively, the position relationship of the two radical-introducing tubes and the carrier is important. For sufficient mixing of the two radicals and their effective utilization, it is desirable that the carrier surface on which a film is to be formed have an angle of preferably 40° to 50°, most preferably 45° to each radical-introducing tube. It is also desirable that the two radical-introducing tubes be symmetrical to each other with respect to the normal line of the carrier surface on which a film is to be formed.

In the present case, the two radical-introducing tubes form a right angle and the carrier and each of these tubes form 45°, and the distance between the carrier and the radical-introducing tubes is made as small as possible (about 1 cm in this case).

As mentioned previously, the $SiF_2$ radical formed by thermal decomposition has a long life of, for example, about several hundred sec under a pressure of about $1 \times 10^{-3}$ Torr, but has a low reactivity; therefore, formation of a-Si film with only $SiF_2$ radical has hitherto been not possible. In the present invention, the $SiF_2$ radical is reacted with a hydrogen radical to convert to a radical of high reactivity, whereby formation of a-Si film is possible. Further, since the $SiF_2$ radical has a long life, it is formed outside the deposition chamber by thermal decomposition and is then introduced into the vicinity of the carrier held in the deposition chamber through the $SiF_2$ radical-introducing tube; therefore, the inside of the deposition chamber is not stained. Furthermore, as can be predicted from the long life of $SiF_2$ radical, a radical such as SiHF or the like formed by the reaction between $SiF_2$ and hydrogen radical has a long life compared with a radical containing no fluorine atom such as $SiH_2$ or the like and can form a deposited film effectively at a faster deposition speed than before.

As to the carrier used in the present invention, there is no particular limitation. Various materials can be used and the shape and size can be appropriately selected depending upon the application of deposited film.

As the material gas for forming the halogen radical used on the present invention, any gas containing Si and halogen atoms can be used. Various silicon halides such as $SiF_4$, $SiCl_4$ and the like are preferable. As the material gas for forming the hydrogen radical, any gas containing hydrogen atoms is usable. $H_2$ gas is preferable because only a desired radical can be produced therefrom.

The halogen radical-introducing tube and the hydrogen radical-introducing tube both used in the present invention apparatus are required to be provided separately in the deposition chamber. As to their materials, shapes and sizes, there is no particular restriction. Various materials, shapes and sizes can be used. These tubes can each be provided in plurality as necessary. In their arrangement in the deposition chamber, it is necessary that a contrivance be made so as to allow sufficient mixing of two radicals. For example, it is preferable that the two tubes be arranged so as to form a right angle as mentioned previously.

In the following, Examples will be given to explain the present invention in further detail.

EXAMPLE 1

Using, as a carrier, a glass substrate in the form of flat plate, an a-Si film was formed on the carrier using the apparatus shown in FIG. 1.

$SiF_4$ gas as a material gas for forming a halogen radical was fed to the reaction furnace 16 maintained at 1,100° C. at a flow rate of 10 sccm and was decomposed therein. The resulting decomposed gas was released from the halogen radical-introducing tube 19 into the deposition chamber 30. Separately, $H_2$ gas was fed to the reaction furnace 26 at a flow rate of 30 sccm and was decomposed by applying to the coil 27 a high frequency (frequency 13.56 MHz, applied power 30 W) and generating glow discharge between the coil 27 and the copper plate 20. The resulting decomposed gas was released from the hydrogen radical-introducing tube 31 into the deposition chamber 30. Incidentally, the material of the glass substrate was Corning 7059 (trade name) of Corning Co., USA and the substrate was maintained at a temperature 250° C.

After 1 hr, an a-Si film of 1.7 μm in thickness was formed on the glass substrate.

Comb-shaped Al electrodes were formed on the a-Si film at an interval of 200 μm to examine the photoconductive characteristic of the film. The a-Si film had a dark conductivity of $7 \times 10^{-9}$ $(\Omega\text{-cm})^{-1}$ and a light conductivity of $2 \times 10^{31\ 5}$ $(\Omega\text{-cm})^{-1}$ under the irradiation of a light of 600 nm having a light intensity of 1.0 mW/cm$^2$ and thus had a good photoconductivity.

After formation of the film, the inside of the deposition chamber 30 was examined but there was no staining except the substrate holder 32.

EXAMPLE 2

Film formation was conducted in the same manner as in Example 1, except that the flow rates of $SiF_4$ gas and $H_2$ gas were increased to two times or three times those of Example 1. After 1 hr, an a-Si film of 3.5 μm in thickness was formed when the gas flow rates were two times, and an a-Si film of 5.4 μm in thickness was formed when the gas flow rates were three times.

Each of these films was subjected to the same evaluation as in Example 1, The film prepared with the flow rate of two times had a dark conductivity of $5 \times 10^{-9}$ $(\Omega\text{-cm})^{-1}$ and a light conductivity of $1 \times 10^{-5}$ $(\Omega\text{-cm})^{-1}$, and the film of prepared with the flow rate of three times had a dark conductivity of $2 \times 10^{-9}$ $(\Omega\text{-cm})^{-1}$ and a light conductivity of $6 \times 10^5$ $(\Omega\text{-cm})^{-1}$; thus, both films had a good photoconductivity. As in Example 1, after formation of the film, there was no staining of the inside of the deposition chamber 30 except the substrate holder 32.

As stated above, in the present invention, by providing a halogen radical-introducing tube for introducing into a deposition chamber a halogen atom-containing radical as well as a hydrogen radical-introducing tube for introducing into the deposition chamber a hydrogen atom-containing radical, the conversion of a halogen radical of low reactivity to a radical of high reactivity and accordingly formation of deposited film at a high deposition speed have been made possible. Since material gases used have no explosiveness and a reaction product is generated only at a site where a film is formed, formation of deposited film has become effective and safe. Further, since radicals can be effectively released to the vicinity of a carrier (film formation site) held in the deposition chamber, the efficiency of material gas utilization has been substantially improved. Furthermore, since no film is formed at unnecessary sites such as the inner wall of deposition chamber and the like, stain is not formed inside the deposition chamber.

I claim:

1. Apparatus for forming a deposition film on a carrier which comprises: a deposition chamber containing a means for holding a carrier; a first means for forming a radical spaced outside said deposition chamber for providing a first radical having a long life and low reactivity and containing at least silicon and halogen atoms, said first radical being generated from a gas selected from the group consisting of SiF$_4$, SiCl$_4$, Si$_2$F$_6$ and mixtures thereof; a second means for forming a radical spaced outside said deposition chamber for providing a second radical containing hydrogen atoms, said second radical being generated from hydrogen gas; means for conducting said silicon and halogen atom-containing radicals from said first means for forming a radical to said deposition chamber; means for conducting said hydrogen atom-containing radicals from said second means for forming a radical to said deposition chamber; each of said means for conducting said silicon and halogen containing radicals and said hydrogen atom-containing radicals having an exit orifice in said deposition chamber (i) which forms an angle between 40° to 50° with the surface of said carrier, (ii) one of said orifices projecting said radicals containing at least silicon and halogen atoms and the other of said orifices simultaneously projecting said radicals containing hydrogen atoms into the deposition chamber and, wherein the projected streams of said silicon and halogen atom-containing radicals and said hydrogen atom-containing radicals are mixed to form a reactive silicon-halogen-hydrogen radical species which promotes accelerated deposition of a film on said carrier by the reaction of said hydrogen atom-containing and silicon and halogen atom-containing radicals and (iii) said exit orifices being symmetrical to each other with respect to a normal line of said carrier.

2. The apparatus of claim 1 in which the said first means for forming a radical includes a reaction furnace for thermally decomposing said gas.

3. The apparatus of claim 1 in which said means for conducting said hydrogen atom-containing radicals is a first tube for introducing hydrogen atom-containing radicals into said chamber, said first tube terminating in said chamber at an angle of 40° to 50° to the surface of said carrier and in which said means for conducting said radicals containing at least silicon and halogen atoms is a second tube for introducing at least silicon and halogen atom-containing radicals into said chamber, said second tube terminating in said chamber at an angle of 40° to 50° to the surface of said carrier.

4. The apparatus of claim 3 in which a plurality of said first tubes are provided.

5. The apparatus of claim 3 wherein a plurality of said second tubes are provided.

6. The apparatus of claim 3 in which said first and second tubes are symmetrical to each other with respect to a normal line of the carrier.

7. The apparatus of claim 1 in which the angle formed by said exit orifices with said carrier surface is about 45°.

8. The apparatus of claim 1 in which said radical containing at least silicon and halogen atoms is SiF$_2$ radical.

9. Apparatus for forming a deposition film on a carrier which comprises: (a) a deposition chamber containing a means for holding a carrier; (b) a first means for forming a radical which includes a reaction furnace and is spaced outside said deposition chamber for providing a radical having a long life and low reactivity and containing at least silicon and halogen atoms, said first radical being generated from a gas selected from the group consisting of SiF4, SiCl$_4$, Si$_2$F$_6$ and mixtures thereof; (c) a second means for forming a radical spaced outside said deposition chamber for providing a second radical containing hydrogen atoms, said second radical being generated from hydrogen gas; (d) means for conducting said silicon and halogen atom-containing radicals to said deposition chamber; (e) means for conducting said hydrogen atom-containing radicals from said second means for forming a radical to said deposition chamber; and (f) each of said means for conducting said silicon and halogen atom-containing radicals and said hydrogen atom-containing radicals having an exit orifice in said deposition chamber (i) which forms an angle between 40° to 50° with the surface of said carrier, (ii) one of said orifices projecting said radicals containing at least silicon and halogen atoms and the other of said orifices simultaneously projecting said radicals containing hydrogen atoms into the deposition chamber and, wherein the projected streams of said silicon and halogen atom-containing radicals and said hydrogen atom-containing radicals are mixed to form a reactive silicon-halogen-hydrogen radical species which promotes accelerated deposition of a film on said carrier by the reaction of said hydrogen atom-containing and silicon and halogen atom-containing radicals and (iii) said exit orifices being symmetrical to each other with respect to a normal line of said carrier.

* * * * *

UNITED STATES PATENT AND TRADEMARK OFFICE
CERTIFICATE OF CORRECTION

PATENT NO. : 5,154,135

DATED : October 13, 1992

INVENTOR(S) : SHUNICHI ISHIHARA

It is certified that error appears in the above-identified patent and that said Letters Patent is hereby corrected as shown below:

COLUMN 1

Line 30, "process," should read --process),--.

COLUMN 2

Line 20, "can not" should read --cannot--.
Line 25, "formed" should read --formed.--.
Line 31, "can not" should read --cannot--.
Line 33, "can not" should read --cannot--.

COLUMN 5

Line 15, "surface" should read --furnace--.

COLUMN 6

Line 56, "$2 \times 10^{31}$ $^{5}$" should read --$2 \times 10^{-5}$--.

COLUMN 7

Line 7, "of" (first occurrence) should be deleted.
Line 9, "$6 \times 10^{5}$" should read --$6 \times 10^{-5}$--.

UNITED STATES PATENT AND TRADEMARK OFFICE
CERTIFICATE OF CORRECTION

PATENT NO. : 5,154,135

DATED : October 13, 1992

INVENTOR(S) : SHUNICHI ISHIHARA

It is certified that error appears in the above-identified patent and that said Letters Patent is hereby corrected as shown below:

COLUMN 8

Line 39, "SiF4," should read --$SiF_4$,--.

Signed and Sealed this

Sixteenth Day of November, 1993

BRUCE LEHMAN

*Commissioner of Patents and Trademarks*

*Attest:*

*Attesting Officer*